United States Patent [19]

Moran, Jr.

[11] Patent Number: 4,734,541

[45] Date of Patent: Mar. 29, 1988

[54] RADIO FREQUENCY DEVICE UTILIZING EMI-BLOCKING COATING AT CONNECTIONS WITH EXTERNAL LEADS

[75] Inventor: James P. Moran, Jr., Farmington, Conn.

[73] Assignee: Loctite Corporation, Newington, Conn.

[21] Appl. No.: 3,873

[22] Filed: Jan. 16, 1987

[51] Int. Cl.[4] ............................................... H05K 9/00
[52] U.S. Cl. .............................. 174/35 R; 174/35 MS
[58] Field of Search .................... 174/35 R, 35 MS; 361/424; 439/607, 608, 609, 610

[56] References Cited

U.S. PATENT DOCUMENTS 4,625,072 11/1986 Van Brunt ........................ 174/35 R Primary Examiner—A. T. Grimley
Assistant Examiner—D. A. Tone
Attorney, Agent, or Firm—Steven J. Hultquist

[57] ABSTRACT

A radio frequency device comprising a signal processing means joined to electromagnectic transmission means, and latently susceptible, at the junction of the signal processing means and the electromagnetic transmission means, to adverse operating effects such as electromagnetic interference (EMI), and/or radio frequency leakage. At this junction is disposed a layer of a material which is blockingly effective against the adverse operating effects, and has a volumetric resistivity of from about $10^{-3}$ to about 2,000 ohm-centimeter.

Also disclosed is a corresponding method of assembling a radio frequency device of such type.

The invention has utility in application to devices such as impedance matching devices, impedance coupling devices, ground protection devices, radar transceivers, and signal splitters, a prefered application being to cable television junction boxes.

47 Claims, 7 Drawing Figures

RADIO FREQUENCY DEVICE UTILIZING EMI-BLOCKING COATING AT CONNECTIONS WITH EXTERNAL LEADS

BACKGROUND OF THE INVENTION

1. Field of the Invention

This invention relates to radio frequency devices of the type comprising a signal processing means joined to electromagnetic transmission means, which in operation are latently susceptible to electromagnetic interference (EMI) and/or radio frequency leakage.

2. Description of the Related Art

In the use of radio frequency (RF) devices, such as for example impedance matching or coupling devices, ground protection devices (ground fault interrupter systems), radar transmitters and/or receivers, and signal splitters, it is well established that EMI and RF leakage into or out of the device seriously adversely affect its operation.

Accordingly, various means have been developed for shielding such devices from electromagnetic or radio frequency interference, e.g., plate member and housings constructed of materials which absorb radio and other electromagnetic waves.

Such shielding elements are generally useful in attenuating EMI/RF interference in the signal processing portion of the device, but do not solve the problem of EMI or RF leakage associated with the junction of this portion and the external leads, e.g., electrical cables or wires, which transmit electromagnetic signals into or out of the signal processing portion.

In some systems, it is conventional practice to utilize "rubber boots" over the couplings joining the signal processing unit and its external leads to eliminate or reduce to a suitably low level the effects of EMI and RF leakage at such couplings. These boots, which are similar in design to the covers used in automotive systems for spark plug connector wires, generally work well initially if properly fitted to cover the associated coupling.

However, the rubber boots, due to the generally high coefficient of friction on the interior surfaces mating with the coupling, frequently tend to be poorly installed, so that they incompletely cover the coupling, and allow EMI and RF leakage to adversely affect the operation of the device.

In systems which are subject in use to vibration, translation, flexural stresses on the leads and/or signal processing unit, etc., the couplings, even if overlaid with rubber boots, tend to loosen, and thereby increase the susceptibility of the system to EMI and RF leakage.

In addition to the foregoing problems, where the RF device is employed in an exterior environment, corrosion of the coupling and associated elements of the device may occur due to atmospheric moisture. Such corrosion may be accelerated by the presence of dissimilar metals in the couplings or adjacent portions of the device, with consequent adverse effect on the structural integrity as well as the performance characteristics of the device.

Poorly fitted, or loosened boots, facilitate the corrosive action. Although it is known to coat the couplings, and the interior surfaces of boots employed thereover, with silicone greases to serve as moisture permeation barriers, such greases dry out and crack or otherwise dissipate in use, so that their anti-corrosion action is lost.

The foregoing problems are especially severe in the case of cable television junction boxes, which are typically employed in exterior environments on overhead or underground signal cables, and have a plurality of couplings joining the box to the signal cable and the service (output) cables. In such environments, the junction box/cable couplings readily tend to work loose, as well as corrode.

Accordingly, it would be a significant advance in the art to provide an improved means for reducing or eliminating EMI as well as RF leakage, at the junction of signal processing means and electromagnetic transmission means (external leads) in RF devices of the type described above, such means preferably providing corrosion protection at such junction.

It is therefore an object of the present invention to provide such an improved means which is readily deployed, simple and economical in character, and adapted in application to existing, as well as contemporaneously fabricated, RF devices.

Other objects and advantages of the invention will be more fully apparent from the ensuing disclosure and appended claims.

SUMMARY OF THE INVENTION

In one aspect, the present invention relates to a radio frequency device comprising a signal processing means joined to electromagnetic transmission means, and latently susceptible, at the junction of the signal processing means and the electromagnetic transmission means, to adverse operating effects selected from one or more of electromagnetic interference, signal loss, signal attenuation, and radio frequency leakage.

In this device, the improvement comprises at the junction of the signal processing means and the electromagnetic transmission means, a layer of a material which is blockingly effective against the adverse operating effects, the material having a volumetric resistivity of from about $10^{-3}$ to about 2,000 ohm-centimeters.

In a related aspect of the invention as broadly described above, the signal processing means comprises electrical circuitry disposed in a housing, the electromagnetic transmission means comprises electrical cable(s), and the junction of the signal processing means and the electromagnetic transmission means comprises interlocking mechanical couplings on the housing and an end of the associated cable(s), such as a threaded female coupling on the housing and a complementarily threaded male coupling on the end of the associated cable.

Another aspect of the invention as broadly described above relates to the material comprising a binder, such as a nylon, rubber, or halogenated vinyl polymer, and an electrically conductive component, such as carbon, aluminum, nickel, copper, or silver, dispersed in the binder.

In another aspect, the invention relates to a method of assembling a radio frequency device of the type described above, wherein the improvement comprises providing, at the junction of the signal processing means and the electromagnetic transmission means, a layer of a material which is blockingly effective against the adverse EMI/RF operating effects, and similar signal loss or attenuation effects, the material having a volumetric resistivity of from about $10^{-3}$ to about 2,000 ohm-centimeters.

Other aspects and features of the invention will be more fully apparent from the ensuing disclosure and appended claims.

BRIEF DESCRIPTON OF THE DRAWINGS

DETAILED DESCRIPTION OF THE INVENTION, AND PREFERRED EMBODIMENTS

Figure 1A:
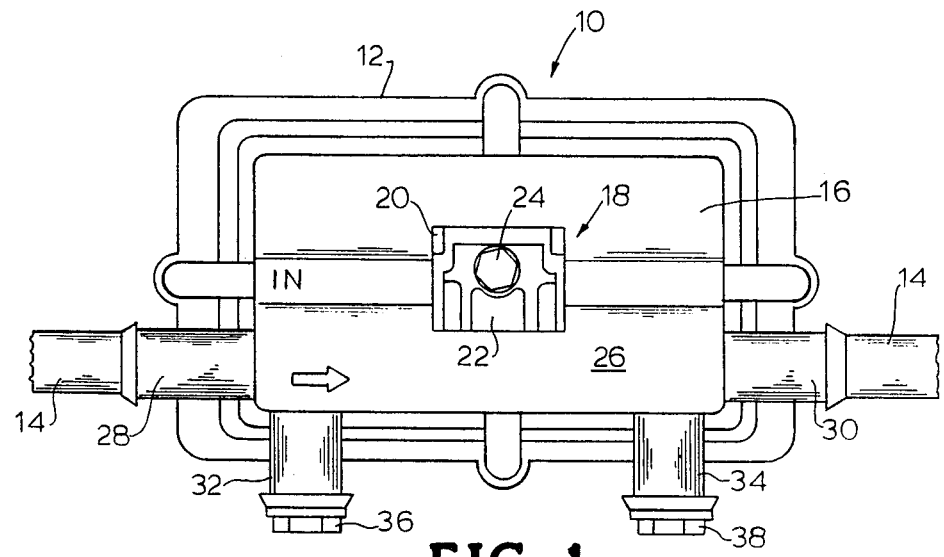
FIG. 1a is a top plan view of a cable television junction box with which the EMI/RF leakage blocking layer of the invention may be employed.

The ensuing description of the invention will be directed primarily to cable television junction boxes as illustrative radio frequency devices with which the EMI/RF leakage blocking layers of the invention may advantageously be employed.

It will be appreciated, however, that the utility of the invention is not thus limited, and extends for example to any device comprising a signal processing means joined to electromagnetic transmission means, and latently susceptible at the junction of these respective means to adverse operating effects associated with EMI, RF leakage (either into or out of the system formed by the signal processing means and the electromagnetic transmission means), signal loss or attenuation due to poor joining of these respective means, etc.

Illustrative devices, of the general type described above, include: impedance matching devices; impedance coupling devices; ground protection (e.g., ground fault interrupter) devices; radar transceivers, such term being understood to include radar transmitters, detectors, and receivers, as well as assemblies combining one or more of such devices; and signal splitters.

The signal processing means referred to above is intended to be broadly construed to include any suitable means for processing a signal, whether electromagnetic, optical, or otherwise, which is connected to external leads (electromagnetic transmission means), and which is latently susceptible to the adverse operating effects described above.

The electromagnetic transmission means referred to above is likewise intended to be broadly construed to include any suitable means for transmitting an electromagnetic signal to and/or from the signal processing means, e.g., wires, cables, waveguides, etc.

In the case of the illustrative cable television (CATV) junction boxes hereinafter more fully described, the signal processing means comprises electrical circuitry disposed in a housing, the electromagnetic transmission means comprises electrical cable(s), and the junction of the signal processing means to the electromagnetic transmission means comprises interlocking mechanical couplings on the housing and an end of the associated cable(s).

As used herein, the "junction of the signal processing means and the electromagnetic transmission means" is intended to be broadly construed to refer to the locus of the joining of these respective means, as may be effected in any suitable manner providing for the passage of electromagnetic signals to and/or from the signal processing means via the electromagnetic transmission means.

A preferred junction structure for the joining of the signal processing means and the electromagnetic transmission means, comprises mechanical connectors or fittings, such as the interlocking mechanical couplings in the illustrative CATV junction box construction above described. Such couplings may suitably include complementarily threaded male and female couplings on the respective elements, e.g., the housing of the junction box, and the end portion of a cable connected thereto.

In accordance with the invention, a layer of a material which is blockingly effective against the various adverse operating effects associated with EMI and RF leakage, is disposed at the junction of the signal processing means and the electromagnetic transmission means.

This material layer suitably has a volumetric resistivity of from about $10^{-3}$ to about 2,000 ohm-centimeters, preferably from about $10^{-1}$ to about 200 ohm-centimeters, and most preferably from about 1 to about 10 ohm-centimeters. Good results have been achieved in practice with layers of materials having volumetric resistivities in the range of from about 6 to about 10 ohm-centimeters.

Such material layer preferably provides a corrosion barrier on the associated junction elements on which it is disposed.

The layer may suitably have a thickness on the order of from about 0.5 to about 125 mils. Good results have been achieved in practice with thicknesses of from about 2 to about 15 mils.

The material may suitably comprise a binder and an electrically conductive component. In general, the conductive component may have a concentration in the material of from about 1 to about 50% by weight, based on the weight of the material (dry solids basis), preferably from about 2 to about 30% by weight, and most preferably from about 10 to about 25% by weight, on the same basis.

The conductive component may be a material such as carbon, aluminum, nickel, copper or silver, and may be dispersed in the material in the form of filaments, flakes, or particles. Preferred components include particulate carbon black (conductive graphite), graphite fibers, and aluminum and silver flakes. Of the foregoing, particulate carbon black is particularly preferred, due to its low cost, ready availability, and easy dispersibility in most binders of interest.

In addition to the foregoing specifically described components, the conductive component may be any suitable element, compound, complex, etc., which has sufficient conductivity, when dispersed in the material in an appropriate amount, to be blockingly effective against EMI and RF leakage in the sytem in which the material is employed.

The binder likewise may be any suitable constituent which provides the material with sufficient integrity to remain in place at the junction locus, without deleterious migration, cracking, or other behavior which would render the material unsuitable for its intended purpose.

Illustrative of specific binders which may be useful in the broad practice of the present invention are those in the classes of nylons, rubbers, halogenated vinyl polymers, and the like.

Examples of potentially useful rubber binders are: nitrile rubbers; acrylonitrile-butadiene-styrene copolymers; polyisoprene; butadiene rubbers; styrene-isoprene copolymers; butadiene-styrene copolymers; and chloroprene rubbers.

Among the nylons which may find utility in the practice of the invention are 6,12-nylons, e.g., Elvamide 8061 and Elvamide 8062 nylons (E.I. DuPont de Nemours & Co.), 12, 12-nylons, and 10,10-nylons.

The halogenated vinyl polymers potentially useful as binders include polyvinylchloride and polyvinylidenefluoride.

Among the foregoing illustratively disclosed binder constituents, rubbers are generally preferred in practice.

As used herein, the term "rubber" is intended to be broadly construed to include not only rubber or elastomeric compositions per se, i.e., those compositions which upon being subjected to deformation under the influence of a tensile stress followed by relaxation of the stress return significantly toward their original shape or length, but also emcompasses constituents which are modified by such compositions, as for example rubberized epoxies, which do not have such shape/length return characteristics.

The EMI/RF leakage blockingly effective layer may be applied to the junction locus of the device as assembled, i.e., with the electromagnetic transmission means joined to the signal processing means, in any suitable manner appropriate to the physical characteristics, e.g., viscosity and rheology, of the material, such as trowelling, spraying, dipping, roller coating, chemical vapor depositing, brushing etc.; or application in the form of a tape which is wound around the junction and secured in place by solvent welding or by use of a pressure sensitive adhesive either applied to the tape or the part.

In many instances, it is desirable to prepare a solven solution of the binder or its precursor (e.g., a monomer which is polymerizably curable to yield the binder), and the conductive constituent. Such solvent solution is then applied in any suitable manner to the junction locus, and dried or otherwise processed to remove the solvent, and yield the solvent-free layer of the material.

A particularly preferred solvent-based composition from which highly useful blockingly effective layers according to the invention have been formed, comprises an ethylene-butylene-styrene block copolymer, commercially available from Shell Chemical Company as KRATON ® G.1650, and 15% by weight, based on the dry solids of the formulation, of conductive carbon powder having an average particle surface area (as measured by standard $N_2$ BET determination) of 2.54 meters$^2$/gram, in 1,1,1-trichloroethane solvent solution.

Another illustrative solvent-based composition for forming the blocking layer, comprises a neoprene rubber (25.4% by weight rubber solids, based on the total weight of rubber and solvent components), and 15% by weight, based on the dry solids of the formulation, of a conductive carbon powder of the type described in the preceding paragraph, in a solvent solution of equal parts by weight of naphtha and methyl ethyl ketone.

The aforementioned solvent-based formulations may be suitably applied to the junction locus of the device as assembled, by dispensing the formulation in a non-aerated form from a pressurized container. A preferred container is the dispensing container manufactured by Lechner AG and commercially available as Lechner 10 Barrier Pack, as packaged by Aerosol Systems, Inc. (Cleveland, Ohio). This container features an inner collapsible aluminum tube filled with the formulation, and surrounded by a pressurized propellant in an outer shell, with the aluminum tube communicating with a dispensing nozzle. Dispensing is effected by manually pressing the nozzle off-center, causing a rapid flow of the formulation in a non-aerated condition.

Figure 1B:
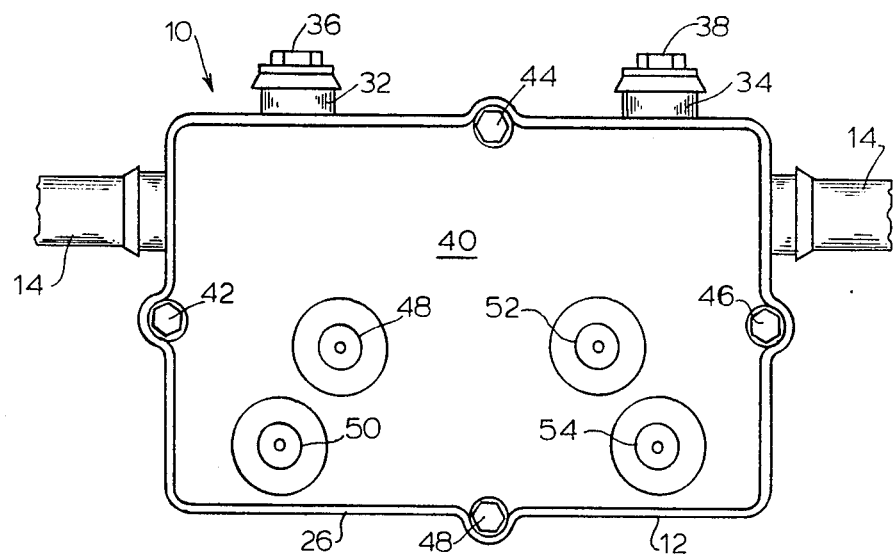
FIG. 1b is a bottom plan view of the junction box of FIG. 1a, showing the connector ports (male couplings) for output signal cable connections.
Figure 1C:
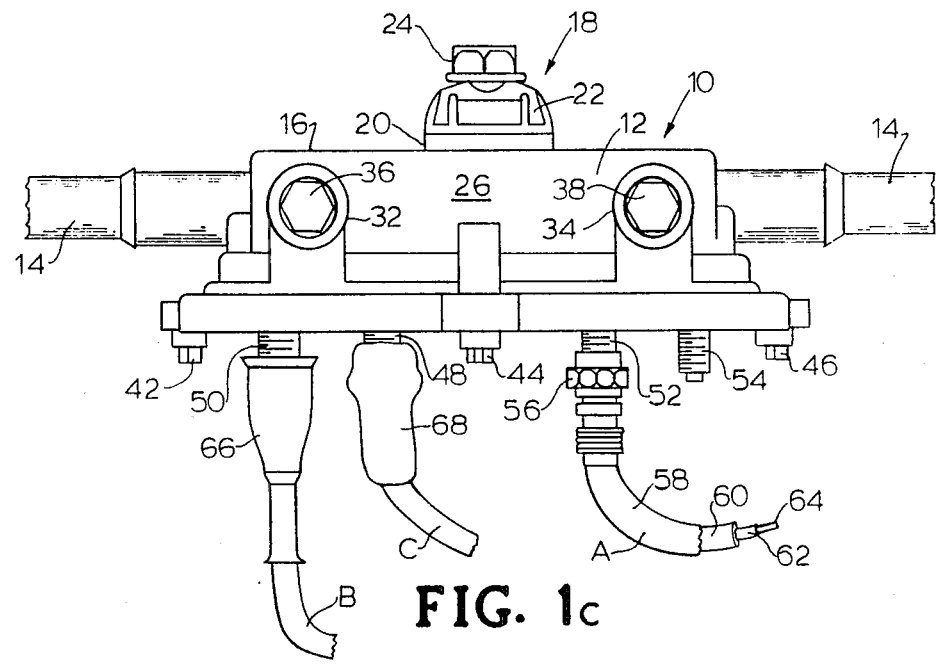
FIG. 1c is a frontal elevational view of the junction box of FIGS. 1a and 1b, showing an output cable A joined by an "F" type coupling to an output port of the junction box, an output cable B featuring a conventional rubber boot over the coupling, and an output cable C featuring the EMI/RF leakage blocking layer of the invention over the coupling at the junction of the cable and the junction box.

Referring now to the drawings, FIG. 1a shows a top plan view of a CATV junction box illustrative of devices with which the blocking layer of the invention may advantageously be employed. FIG. 1b is a bottom plan view of the same device, and FIG. 1c is a frontal elevational view of the device including cable connections representative of prior practice and the present invention. In each of the drawings, the same reference numerals refer to the same elements.

The junction box assembly 10 comprises junction box 12, input signal (main) cable 14, and output cables A, B, and C as shown in FIG. 1c.

Within the junction box 12 is disposed signal processing and impedance matching circuitry (not shown for the sake of simplicity) in electrical communication with main cable 14 and the output cables A, B, and C, to process the CATV signal received by the box from the main cable and send corresponding separate signals out to the receiving units through the output cables A, B, and C.

The junction box has on its top surface 16 a wire mounting assembly 18 for suspending the junction box from a support wire when the main cable and junction box are positioned overhead by a sequence of upwardly extending poles, in the manner of telephone lines.

The wire mounting assembly 18 comprises a base portion 20 which is integrally formed with the main body portion 26 of the junction box, as for example when the junction box main body portion is formed of die cast aluminum, or alternatively, the base portion 20 may be welded or otherwise attached to the top surface of the main body portion of the junction box.

A clamp 22 which is tightenably adjustable against the base portion 20, by means of the tightenable bolt 24, enables the wire mounting assembly to be clamped over an overhead support wire readily and detachably (to provide for removal and servicing).

Alternatively, the junction box may be mounted underground in some installations, or wall-mounted as in the case of CATV service to a multiple dwelling unit such as an apartment building, and in such instances the mounting assembly may take the form of other constructions for securing the junction box to its associated mounting substrate.

The main cable 14 enters the junction box in inlet port 28 and exits the box at outlet port 30. The box is also provided with frontal inlet and outlet ports, 32 and 34, respectively, for the main cable, as an alternative to the end ports 28 and 30, the frontal ports being used in instances where they accommodate the main cable configuration better than the end ports.

In FIGS. 1a–1c, the unused ports 32 and 34 are sealed with bolt/washer closures 36 and 38, respectively.

As best shown in FIG. 1b, the main body portion 26 of the junction box is joined to a bottom closure plate 40, by means of the fastener screws 42, 44, 46, and 48, so that the junction box is fully enclosed to protect the circuitry contained therein.

Extending through the bottom closure plate 40 are output ports 48, 50, 52, and 54 providing the male connector elements for joining the output signal cables to the junction box.

Each of the output ports is threaded to mate with a complementarily threaded female coupling at the end of an output signal cable, as is shown in FIG. 1c, in which the output port 52 has connected thereto the threaded female coupling 56 mounted at the end of signal output cable A.

Illustrative of female couplings which may be usefully employed in junction box assemblies of the type shown in FIGS. 1a–c are so-called "F" connectors which are 7/16 UNF female ferrule fittings commonly employed in CATV systems. Ferrule fittings of such type may be formed of aluminum, while the outlet port, often referred to as a "port stud", may suitably be formed of diecast aluminum or brass.

The output cables A, B, and C are similarly constructed coaxial cables of a type (refer to cable A) having an outer jacket 58 of insulation material, e.g., a vinyl wire covering, within which is a braid layer 60 of woven wire braid, a dielectric layer 62, and the central conductor 64. The central conductor may be formed of copper, and the jacket 58 and dielectric layer 62 may have further layers of aluminum foil bonded to their respective facing surfaces, in a known manner.

An illustrative coaxial cable of the foregoing type which may advantageously be employed in devices according to the present invention, is Belden T 9052 Duobond Plus CATV COAX 20 AWG 75 OHM PG coaxial cable, commerically available from Belden Corporation, Electronic Division, Richmond, Indiana.

As shown in FIG. 1c, cable B is provided with a rubber boot 66 over the coupling fitting at the end segment of the cable, and the associated port 50. This is representative of current practice in the CATV industry for protecting the junction in such systems. The boot may be formed of neoprene rubber and it is known to apply a silicone grease over the junction fittings to increase the sealing capability of the boot, and enhance its shielding ability when dielectric greases are employed.

The EMI/RF leakage problems associated with the use of rubber boots relates to their tendency to be improperly installed, so that they do not cover the entire junction intended to be protected, and/or to loosen in use due to virbration or flexing (e.g., as due to wind induced sway, in overhead mounted systems). If the boot becomes disengaged and moves down the cable, away from the junction, it can become filled with water, and exacerbate the EMI/RF leakage effects as well as accelerate corrosion of the coupling elements.

The above-described EMI/RF leakage problems associated with the use of rubber boots, are overcome in accordance with the present invention by the provision of a layer of a material which is blockingly effective against such interference and leakage. This is shown in FIG. 1c, where the junction defined by the female coupling fitting on cable C, and the associated port 48, is covered by the blocking layer 68 of a material such as previously described herein, e.g., an ethylene-butylene-styrene block copolymer rubber containing a blockingly effective amount of a conductive carbon filler.

The blocking layer 68 provides a continuous coating over the junction and thus serves as a mositure barrier opposing corrosion of the underlying coupling fittings. Further, the presence of the conductive component therein permits the layer to minimize or prevent EMI and RF leakage, even when the fittings over which the layer is applied are poorly, i.e., loosely, coupled.

The latter feature of protecting poorly coupled junctions is very significant, since commercial installers of CATV systems frequently do not tighten the coupling fittings adequately when the system is installed or serviced, and this factor is a major source of maintenance work for many CATV companies.

In order to enhance the effectiveness of the material used in the blocking layer, it may be desirable in some instances to incorporate in the material anti-corrosion additives, e.g., chromium or zinc fillers, such as in coastal areas where the ambient environment is highly corrosive in character.

It may also be advantageous in some applications, to enhance the sealing ability of the layer by the incorporation in the material of adhesion promotors, flux components, and the like. Depending on the viscosity characteristics of the material, there will be wetting action on the coupling fittings, and capillarity effects may draw some of the material into the adjacent threads within the coupled fittings. Accordingly, it may be desirable to include in the material constituents which provide threadlocking in the coupled threads at the junction in the assembled device.

It will be appreciated that any suitable additives may be employed in the blocking layer material which do not adversely affect the utility of the material for its intended purpose. For example, useful additives may include antioxidants, UV stabilizers, pigments, fillers, etc.

In instances where the blocking layer is formed from a precursor composition, as where a monomer, prepolymer, or other reactant is reacted subsequent to application of the composition to the junction, to yield a film-forming reaction product as the material of the layer, it may likewise be desirable to include various suitable additives in the precursor composition, such as polymerization initiators, accelerators, chain extenders, reactive diluents, inhibitors, etc.

Figure 2:
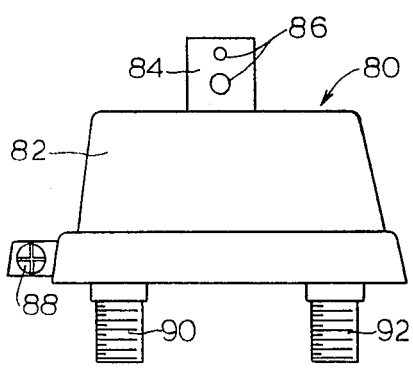
FIG. 2 is a frontal elevational view of a high pass filter device, suitable for use with the blocking layer of the invention.

FIG. 2 is a frontal elevational view of a high pass filter device 80, with which the blocking layer of the invention may be employed. The device comprises housing 82, from the rear top portion of which upwardly depends mounting flange 84. The mounting flange is provided with mounting holes 86, through which mounting screws or other fastening means may be passed to secure the device in a predetermined position.

At the base portion of the housing 82 is a laterally extending flange equipped with a set screw 88 to accommodate the fastening of the device to a suitable ground wire passing through an orifice in the flange and held in place by the set screw.

Extending downwardly from the base portion of the housing are an outlet port 90 and an inlet port 92, each of which is joined in electrical communication with high pass filter circuitry disposed within the housing, and each of which may be joined to respective cables in the manner shown and described in connection with FIG. 1c.

Figure 3:
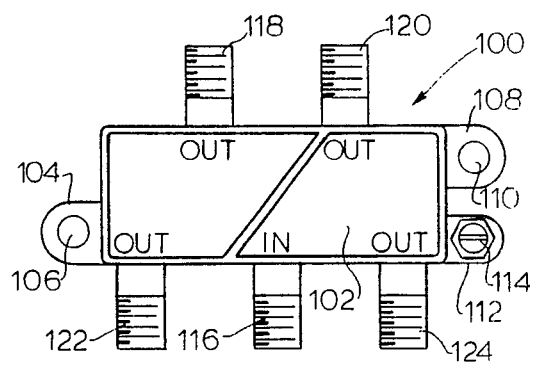
FIG. 3 is a top plan view of a 5-500 MHZ 4-way signal splitter device, with which the blocking layer of the invention may advantageously be used.

FIG. 3 shows a top plan view of a 5-500 MHZ 4-way signal splitter, with which the blocking layer of the invention may advantageously be used.

The splitter 100 comprises a main body portion 102 defining a housing within which the splitter circuitry is disposed. The main body portion has extending therefrom mounting flanges 104 and 108, featuring fastener openings 106 and 110, for mounting the splitter in a predetermined position. Also attached to the main body portion of the splitter is a ground flange featuring adjustable set screw 114, to which a suitable ground wire may be connected.

This splitter features one inlet port 116 and four outlet ports 118, 120, 122, and 124, to which the appropriate signal cables may be attached in the manner shown and described in connection with FIG. 1b.

In both of the FIG. 2 and FIG. 3 devices, the female cable connectors to be joined to the various inlet and outlet ports may be sealed against EMI and RF leakage in the same manner as described in connection with cable C in FIG. 1c, by provision at the junction of a layer of a blocking material as herein disclosed.

The features and advantages of the invention are more fully illustrated with reference to the following Examples, wherein all parts and percentages are by weight, unless otherwise specifically stated.

EXAMPLE I

An EMI/RF leakage blocking material composition was made up having the composition set forth in Table I below.

TABLE I

| Component | Concentration, % |
|---|---|
| ethylene-butylene-styrene block copolymer rubber (KRATON ® G.1650; Shell Chemical Company) | 21.0 |
| graphite powder (Vulcon XC72; Cabot Corp.) | 3.5 |
| 1,1,1- trichloroethane | 74.5 |
| fumed silica (Aerosil 200; DeGussa AG) | 1.0 |

The graphite powder was thoroughly dispersed in the rubber binder, and the resulting mixture let down in the chlorinated hydrocarbon solvent, to yield a viscous, yet flowable composition.

This composition was applied by pouring same onto the junction of an output cable and CATV junction box of the type shown and described in connection with FIGS. 1a–1c, over the female coupling fitting and the associated port of the junction box.

The junction to which the composition was applied initially exhibited a high level of RF leakage due to the female coupling fitting being only loosely connected to the associated port of the junction box. The poor connection was intentionally made to simulate the coupling obtained in use of the junction box upon exposure to vibration, flexing of the cable, repeated thermal expansion and contraction under extreme weather conditions, etc.

After application of the composition to the junction, the composition was dried with a fan for 1½ hours, then dried under ambient conditions for three days to remove solvent and produce a dried coating as the blocking layer.

A comparative control featured a wrench-tightened female coupling fitting on another port of the junction box.

Figure 4:
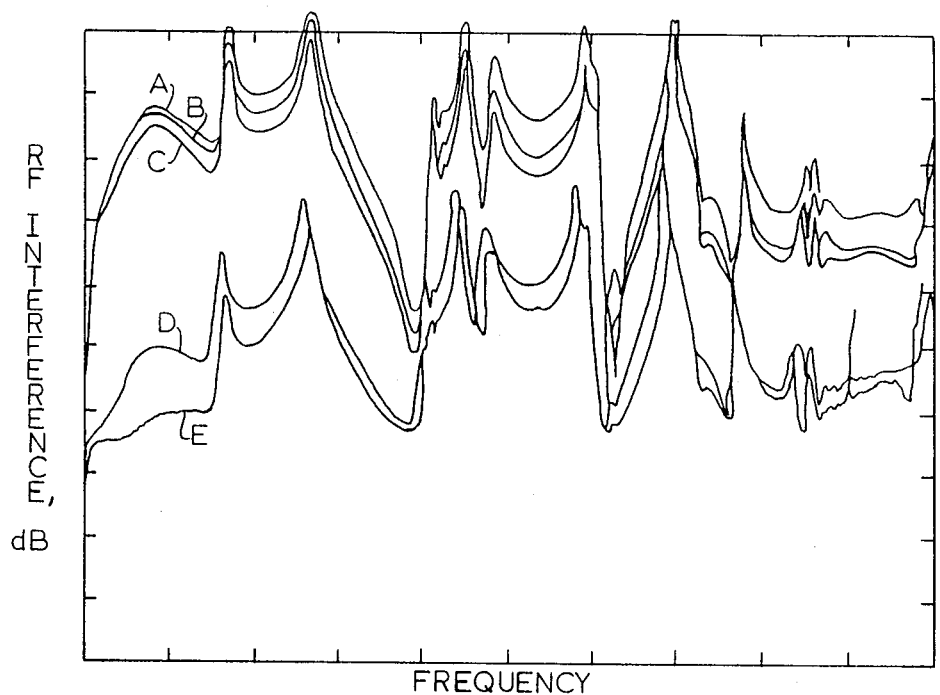
FIG. 4 is a plot of radio frequency leakage, in decibels, measured at the junction (port coupling) of output cables and a junction box of the type shown in FIGS. 1a-1c, plotted as a function of frequency for various connections, and showing the improvement afforded by the blocking layer of the invention.

Using a radio frequency interference detector, the RF leakage from the respective couplings, in decibels, was measured as a function of frequency, with the results shown in FIG. 4.

In this plot, curve A represents the characteristics of the loose coupling before it was coated with the composition described above to form an RF leakage blocking layer according to the present invention. Curve B represents the performance of the same coupling immediately after coating with the blocking composition; curve C after 1½ hours of fan drying; and curve D after ambient drying for 3 days. Curve E represents the RF leakage characteristics of a corresponding wrench tightened coupling, as a control; this coupling had no blocking layer in accordance with the invention, and thus represented a baseline of good performance against which the efficacy of the invention could be measured, as "fixing" a poor connection.

Curves A–C show that a significant attenuation of the radio frequency interference of the poor connection occurred immediately after the coupling was coated with the blocking layer material and thereafter substantially progressed, so that after 3 days of ambient cure, the blocking layer yielded an attenuation of the interference which approached the good performance achieved by the wrench-tightened connecton.

The foregoing curves show the efficacy of the invention in providing superior attenuation of the radio frequency interference associated with a poor connection, to a level consistent with the magnitude of interference associated with a good connection.

EXAMPLE II

The procedure of Example I was repeated, and radio frequency interference was measured for the wrench-tightened connection (curve A), the loose connection (curve B), and the loose connection to which the formulation of Table I had been applied, after overnight drying of the applied layer (curve C).

Figure 5:
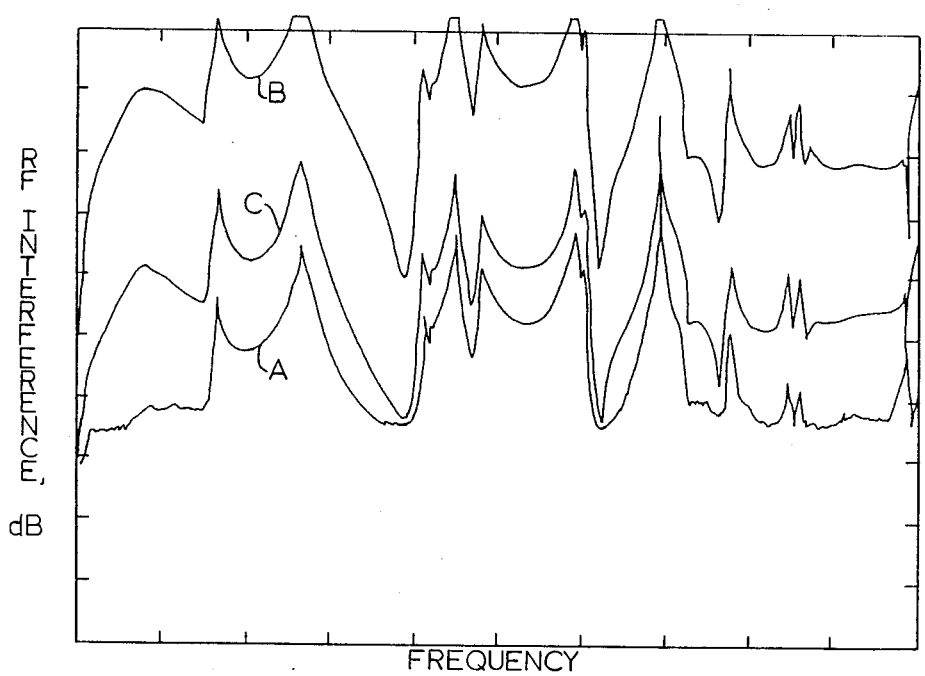
FIG. 5 is a plot similar to that shown in FIG. 4, indicating the efficacy of the blocking layer according to the invention.

The results are shown in FIG. 5, and are generally consistent with those of FIG. 4, showing the attenuation of the RF interference associated with the poor connection toward the level associated with the good connection.

While preferred embodiments and features of the invention have been described in detail, it will be appreciated that other embodiments, variations, and modifications are contemplated, and accordingly, all such apparent embodiments, variations, and modifications are to be regarded as being within the spirit and scope of the invention.

What is claimed is:

1. A radio frequency device comprising a signal processing means joined to electromagnetic transmission means, and latently susceptible, at the junction of the signal processing means and the electromagnetic transmission means, to adverse operating effects selected from one or more of electromagnetic interference, signal loss, signal attenuation, and radio frequency leakage, wherein the improvement comprises at the junction of the signal processing means and the electromagnetic transmission means, a layer of a material which is blockingly effective against the adverse operating effects, the material having a volumetric resistivity of from about $10^{-3}$ to about 2,000 ohm-centimeters.

2. A device according to claim 1, wherein the signal processing means comprises electrical circuitry disposed in a housing, the electromagnetic transmission means comprises electrical cable, and the junction of the signal processing means to the electromagnetic transmission means comprises interlocking mechanical couplings on the housing and an end of the associated cable.

3. A device according to claim 2, wherein the interlocking mechanical couplings comprise a threaded female coupling on the housing and a complementarily threaded male coupling on the end of the associated cable.

4. A device according to claim 1, selected from the group consisting of: impedance matching devices; impedance coupling devices; ground protection devices; radar transceivers; and signal splitters.

5. A device according to claim 1, wherein the material comprises a binder and an electrically conductive component.

6. A device according to claim 5, wherein the binder is selected from the group consisting of nylons, rubbers, and halogenated vinyl polymers.

7. A device according to claim 5, wherein the binder is a rubber.

8. A device according to claim 7, wherein the rubber is selected from the group consisting of: nitrile rubbers; acrylonitrile-butadiene-styrene copolymers; polyisoprene; butadiene rubbers; styrene-isoprene copolymers; butadienestyrene copolymers; and chloroprene rubbers.

9. A device according to claim 5, wherein the binder is nylon.

10. A device according to claim 5, wherein the binder is a halogenated vinyl polymer selected from the group consisting of polyvinylchloride and polyvinylidenefluoride.

11. A device according to claim 5, wherein the conductive component has a concentration in the material of from about 1 to about 50% by weight, based on the weight of the material.

12. A device according to claim 5, wherein the conductive component has a concentration in the material of from about 2 to about 30% by weight, based on the weight of the material.

13. A device according to claim 5, wherein the conductive component has a concentration in the material of from about 10 to about 25% by weight, based on the weight of the material.

14. A device according to claim 5, wherein the conductive component is selected from the group consisting of carbon, aluminum, nickel, copper, and silver.

15. A device according to claim 5, wherein the conductive component is in the form of filaments dispersed in the material.

16. A device according to claim 5, wherein the conductive component is in the form of flakes dispersed in the material.

17. A device according to claim 5, wherein the conductive component is in the form of particles dispersed in the material.

18. A device according to claim 5, wherein the conductive component is particulate carbon black.

19. A device according to claim 5, wherein the binder is a rubber and the conductive component is graphite powder.

20. A device according to claim 19, wherein the layer is derived from a solution of the material in 1,1,1-trichloroethane, applied to the junction and dried to remove solvent therefrom.

21. A device according to claim 1, wherein the material layer is derived from a solvent solution of the material or its precursor, as applied to the junction and dried to remove the solvent therefrom.

22. A device according to claim 21, wherein the solvent solution of the material or its precursor, has a solids concentration of from about 10 to about 90 percent by weight, based on the total weight of the solution.

23. A device according to claim 21, wherein the solvent solution of the material or its precursor, has a solids concentration of from about 10 to about 50 percent by weight, based on the total weight of the solution.

24. A device according to claim 21, wherein the solvent solution of the material or its precursor, has a solids concentration of from about 12 to about 40 percent by weight, based on the total weight of the solution.

25. A device according to claim 21, wherein the solvent solution of the material or its precursor, has a solids concentration of from about 16 to about 25 percent by weight, based on the total weight of the solution.

26. A device according to claim 1, wherein the thickness of the layer is from about 0.5 to about 125 mils.

27. A device according to claim 1, wherein the thickness of the layer is from about 2 to about 15 mils.

28. A device according to claim 1, wherein the material has a volumetric resistivity of from about $10^{-1}$ to about 200 ohm-centimeters.

29. A device according to claim 1, wherein the material has a volumetric resistivity of from about 1 to about 10 ohm-centimeters.

30. A cable television junction box assembly, comprising a junction box to which are joined an input signal cable and plural output signal cables, and latently susceptible at the junction of the cables and the junction box to adverse operating effects selected from one or more of electromagnetic interference, signal loss, signal attenuation, and radio frequency leakge, wherein the improvment comprises at the junction of at least one cable and the junction box, a layer of a material which is blockingly effective against the adverse operating effects, the material having a volumetric resistivity of from about $10^{-3}$ to about 2,000 ohm-centimeters.

31. In a method of assembling a radio frequency device comprising joining a signal processing means to electromagnetic transmission means, wherein the resulting device is latently susceptible at the junction of the signal processing means and the electromagnetic transmission means, to adverse operating effects selected from one or more of electromagnetic interferences, signal loss, signal attenuation, and radio frequency leakage, the improvement comprising providing, at the junction of the signal processing means and the electromagnetic transmission means, a layer of a material which is blockingly effective against the adverse operating effects, the material having a volumetric resistivity of from about $10^{-3}$ to about 2,000 ohm-centimeters.

32. A method according to claim 31, wherein the material comprises a binder and an electrically conductive component.

33. A method according to claim 32, wherein the binder is selected from the group consisting of nylons, rubbers, and halogenated vinyl polymers.

34. A method according to claim 32, wherein the conductive component has a concentration in the material of from about 1 to about 50% by weight, based on the weight of the material.

35. A method according to claim 32, wherein the conducting component has a concentration in the material of from about 2 to about 30% by weight, based on the weight of the material.

36. A method according to claim 32, wherein the conducting component has a concentration in the material of from about 10 to about 25% by weight, based on the weight of the material.

37. A method according to claim 32, wherein the conducting component is selected from the group consisting of carbon, aluminum, nickel, copper, and silver.

38. A method according to claim 31, wherein the material layer is provided by applying a solvent solution of the material, or its precursor, to the junction, and drying the applied solution to remove the solvent therefrom.

39. A method according to claim 38, wherein the solvent solution of the material or its precursor, has a solids concentration of from about 10 to about 90% by weight, based on the total weight of the solution.

40. A method according to claim 38, wherein the solvent solution of the material or its precursor, has a solids concentration of from about 10 to about 50% by weight, based on the total weight of the solution.

41. A method according to claim 38, wherein the solvent solution of the material or its precursor, has a solids concentration of from about 12 to about 40% by weight, based on the total weight of the solution.

42. A method according to claim 38, wherein the solvent solution of the material or its precursor, has a solids concentration of from about 16 to about 25% by weight, based on the total weight of the solution.

43. A method according to claim 31, wherein the thickness of the layer is from about 0.5 to about 125 mils.

44. A method according to claim 31, wherein the thickness of the layer is from about 2 to about 15 mils.

45. A method according to claim 31, wherein the material has a volumetric resistivity of from about $10^{-1}$ to about 200 ohm-centimeters.

46. A method according to claim 31, wherein the material has a volumetric resistivity of from about 1 to about 10 ohm-centimeters.

47. In a method of assembling a cable television junction box assembly, comprising joining an input signal cable and plural output signal cables to a junction box, wherein the resulting junction box assembly is latently susceptible, at the junctions of the cables and the junction box, to adverse operating effects selected from one or more of electromagnetic interference, signal loss, signal attenuation, and radio frequency leakage, the improvement comprising providing, at the junction of at least one cable and the junction box, a layer of a material which is blockingly effective against the adverse operating effects, the material having a volumetric resistivity of from about $10^{-3}$ to about 2,000 ohm-centimeters.

* * * * *